United States Patent
Shibata (10) Patent No.: US 7,745,866 B2
(45) Date of Patent: Jun. 29, 2010

(54) SEMICONDUCTOR DEVICE AND METHOD FOR FABRICATING THE SAME

(75) Inventor: Yoshiyuki Shibata, Shiga (JP)

(73) Assignee: Panasonic Corporation, Osaka (JP)

( * ) Notice: Subject to any disclaimer, the term of this patent is extended or adjusted under 35 U.S.C. 154(b) by 126 days.

(21) Appl. No.: 11/907,439

(22) Filed: Oct. 12, 2007

(65) Prior Publication Data

US 2008/0142863 A1 Jun. 19, 2008

(30) Foreign Application Priority Data

Dec. 13, 2006 (JP) .............................. 2006-336231

(51) Int. Cl.
*H01L 27/108* (2006.01)
*H01L 29/76* (2006.01)
(52) U.S. Cl. ................. 257/303; 257/301; 257/306; 257/308; 438/244; 438/253
(58) Field of Classification Search ................. 257/303, 257/301, 306, 308, E21.646, E27.084; 438/244, 438/253
See application file for complete search history.

(56) References Cited

U.S. PATENT DOCUMENTS

| 6,072,210 | A  | * | 6/2000 | Choi ........................... 257/303 |
| 6,794,694 | B2 | * | 9/2004 | Diodato et al. .............. 257/295 |
| 7,476,922 | B2 | * | 1/2009 | Won et al. ................... 257/301 |
| 2002/0084480 | A1 | * | 7/2002 | Basceri et al. .............. 257/306 |

FOREIGN PATENT DOCUMENTS

JP        2004-349462        12/2004

* cited by examiner

*Primary Examiner*—Theresa T Doan
(74) *Attorney, Agent, or Firm*—McDermott Will & Emery LLP (57) ABSTRACT

A semiconductor device includes a capacitor which has: a lower electrode formed along an opening provided above a semiconductor substrate to have a concave cross section; a capacitor insulating film formed on the inner and top surfaces of the lower electrode; and an upper electrode formed on the capacitor insulating film. The upper electrode includes: a first conductive film formed on the inner surface of the capacitor insulating film and filling the opening; and a second conductive film formed to extend from the top surface of the first conductive film to the top surface of the capacitor insulating film.

20 Claims, 7 Drawing Sheets

SEMICONDUCTOR DEVICE AND METHOD FOR FABRICATING THE SAME

BACKGROUND OF THE INVENTION (a) Fields of the Invention

The present invention relates to semiconductor devices used as, for example, DRAMs (Dynamic Random Access Memories), and to their fabrication methods.

(b) Description of Related Art

In recent years, as DRAMs as semiconductor memory devices have been increasing in capacity, miniaturization thereof has been advancing. Capacitor structures of the DRAMs are roughly classified into: a trench structure in which a trench is formed in a silicon substrate and a capacitor is formed inside the formed trench; and a stacked structure in which a capacitor is formed in a stacked film over a substrate. In order to accomplish miniaturization of the DRAM, a trench-shaped stacked capacitor structure is employed as the stacked capacitor. This structure is constructed so that a trench for forming a capacitor is formed in an interlayer insulating film, and a lower electrode, a capacitor insulating film, and an upper electrode are sequentially provided on a side wall and a bottom surface of the trench. For such a trench-shaped stacked capacitor structure, in order to maintain the charge retention capability and ensure a sufficient cell capacitance, the trench for forming the capacitor should be formed to have a greater depth. Along with this formation, a contact plug for connecting an interconnect layer to the substrate should also be elongated. Therefore, the following requirements are demanded of the trench-shaped stacked capacitor structure: suppression of parasitic capacitance, which is produced between the upper electrode and the interconnect, by providing the sufficiently-thick interlayer insulating film on the upper electrode; and easy formation of the contact plug penetrating the interlayer insulating film.

Figure 4:
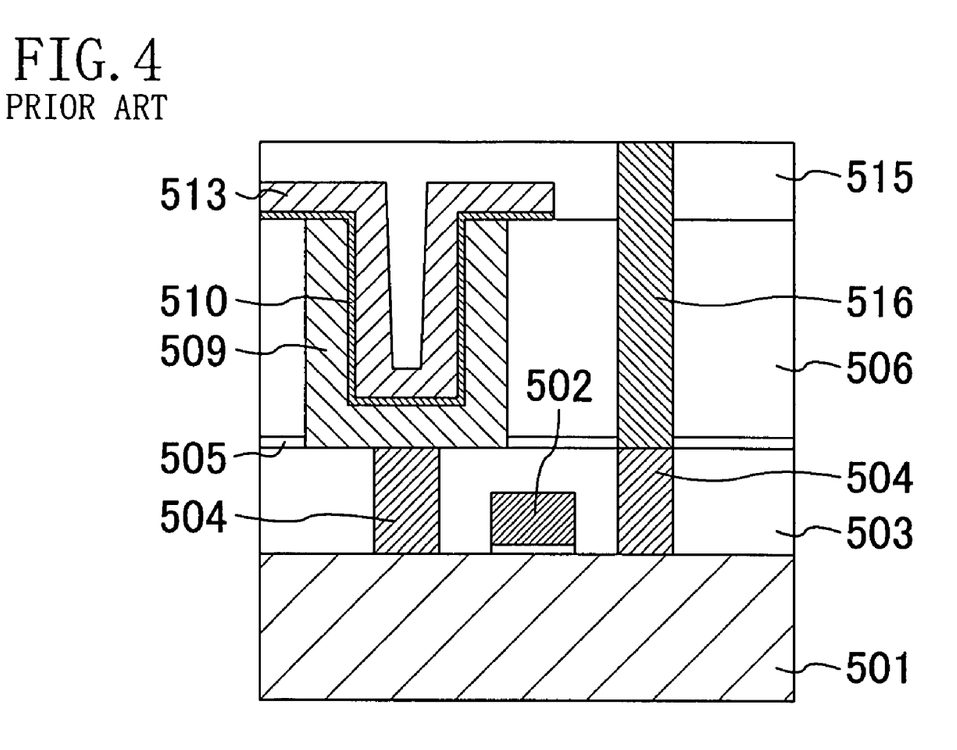
FIG. 4 is a sectional view showing the structure of a conventional DRAM with a stacked capacitor.

Herein, description will be made of a conventional DRAM with a typical trench-shaped stacked capacitor as shown in, for example, Japanese Unexamined Patent Publication No. 2004-349462 and its fabrication method. FIG. 4 is a sectional view showing the structure of the conventional DRAM with the stacked capacitor.

Referring to FIG. 4, the conventional DRAM includes: a silicon substrate 501; a DRAM cell transistor gate 502 formed over the silicon substrate 501; a first interlayer film 503 formed on the silicon substrate 501 and the DRAM cell transistor gate 502; first contact plugs 504a and 504b which are formed on impurity diffusion layers (not shown) provided in the silicon substrate 501, respectively, and which penetrate the first interlayer film 503; a silicon nitride film 505 formed on the first interlayer film 503; and a second interlayer film 506 formed on the silicon nitride film 505 and provided with a trench reaching the top surface of the first contact plug 504a.

Furthermore, the conventional DRAM is formed with: a lower electrode 509, a capacitor insulating film 510, and an upper electrode 513 sequentially formed from bottom to top in the trench provided in the second interlayer film 506; a third interlayer film 515 formed on the upper electrode 513 and the second interlayer film 506; and a second contact plug 516 formed on the first contact plug 504b and penetrating the second interlayer film 506 and the third interlayer film 515. Through the first contact plug 504a, the impurity diffusion layer and the lower electrode 509 are electrically connected to each other.

As described above, the conventional DRAM shown in FIG. 4 has the structure in which a portion of the upper electrode 513 is formed above the second interlayer film 506 and the top surface of the upper electrode 513 and the side surface of the top end thereof are in contact with the third interlayer film 515.

Next, a conventional method for fabricating a DRAM with a stacked capacitor will be described with reference to the accompanying drawings. FIGS. 5A to 5I and 6A to 6C are sectional views showing the conventional method for fabricating a DRAM, respectively.

Figure 5A:
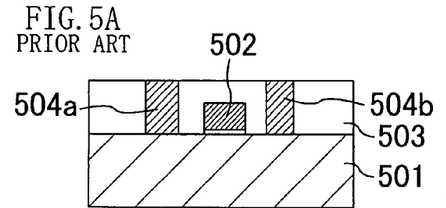
FIGS. 5A to 5I are sectional views showing a conventional method for fabricating a semiconductor device.

Referring to FIG. 5A, first, the DRAM cell transistor gate 502 is formed above the silicon substrate 501, and then the first interlayer film 503 is formed on the silicon substrate 501 and the DRAM cell transistor gate 502. Then, the first contact plugs 504a and 504b penetrating the first interlayer film 503 are formed on the impurity diffusion layers (not shown) formed in the silicon substrate 501, respectively.

Figure 5B:
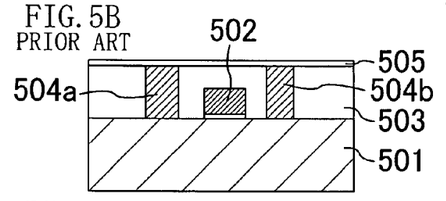
Figure 5C:
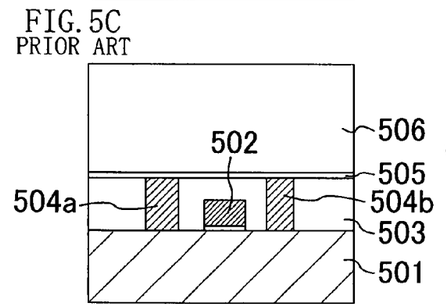

Next, as shown in FIG. 5B, the silicon nitride film 505 is deposited on the first interlayer film 503 and the first contact plugs 504a and 504b. Thereafter, as shown in FIG. 5C, on the silicon nitride film 505, the second interlayer film 506 is formed by a chemical vapor deposition (CVD) method.

Figure 5D:
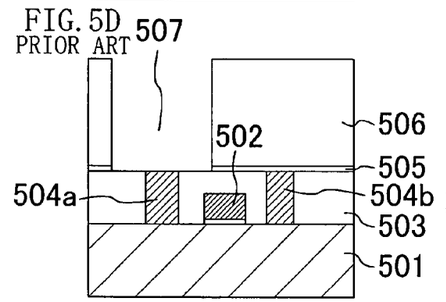
Figure 5E:
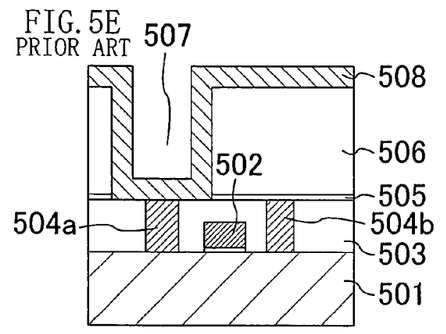
Figure 5F:
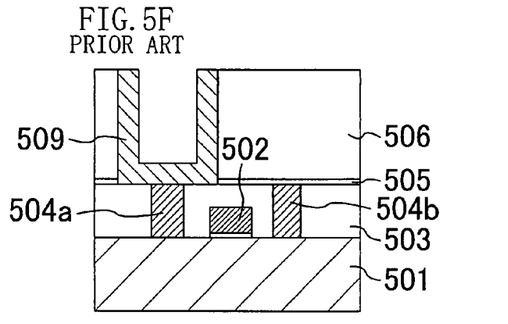

Subsequently, as shown in FIG. 5D, through the second interlayer film 506, a trench 507 reaching the top surface of the first contact plug 504a is formed by a lithography method and a dry etching. Thereafter, as shown in FIG. 5E, a first conductive film 508 is deposited on the inner surface of the trench 507 and the top surface of the second interlayer film 506. Then, as shown in FIG. 5F, by a lithography method and a dry etching, the first conductive film 508 deposited on the top surface of the second interlayer film 506 is removed so that it remains only on the inner surface of the trench 507, thereby forming the lower electrode 509 made of the first conductive film.

Figure 5G:
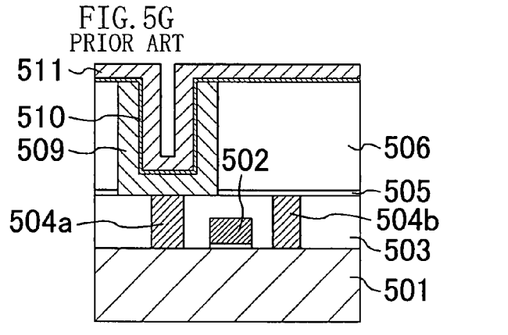

As shown in FIG. 5G, the capacitor insulating film 510 is deposited on the second interlayer film 506 and the lower electrode 509, and then a second conductive film 511 is deposited on the capacitor insulating film 510.

Figure 5H:
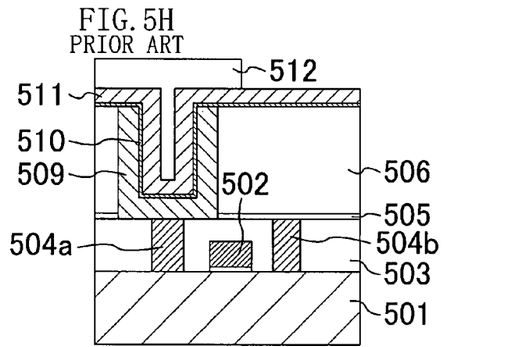
Figure 5I:
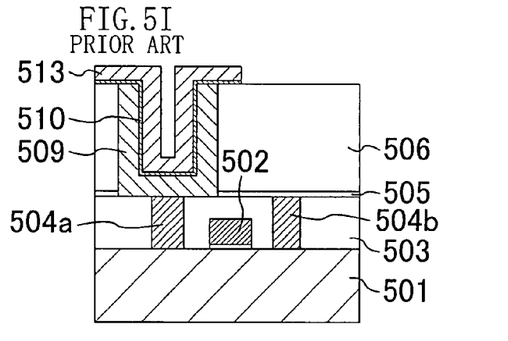

Next, as shown in FIG. 5H, on the second conductive film 511, a photoresist mask 512 is formed by a lithography method. Thereafter, as shown in FIG. 5I, portions of the capacitor insulating film 510 and the second conductive film 511 are removed by a dry etching using the photoresist mask 512 as a mask to form a capacitor having the lower electrode 509, the capacitor insulating film 510, and the upper electrode made of the second conductive film 511. In the manner described above, the portion of the upper electrode 513 is formed above the second interlayer film 506.

Figure 6A:
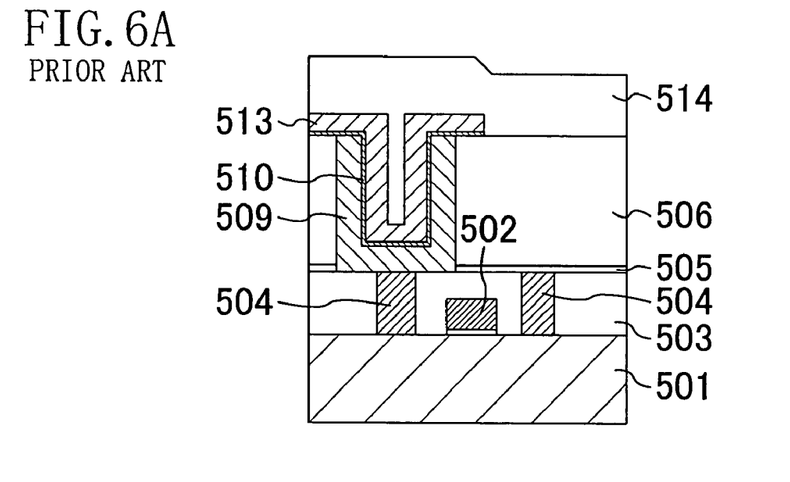
FIGS. 6A to 6C are sectional views showing the conventional method for fabricating a semiconductor device.

Subsequently, as shown in FIG. 6A, for example, a silicon oxide film 514 is deposited on the second interlayer film 506 and the upper electrode 513. In this deposition, the silicon oxide film 514 is made thicker than the upper electrode 513.

Figure 6B:
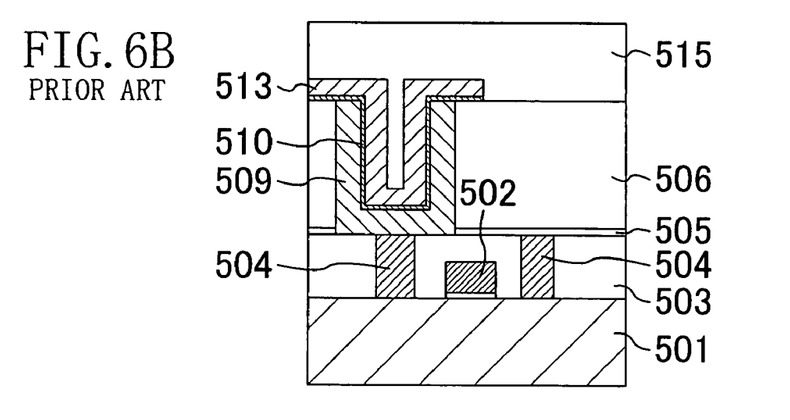
Figure 6C:
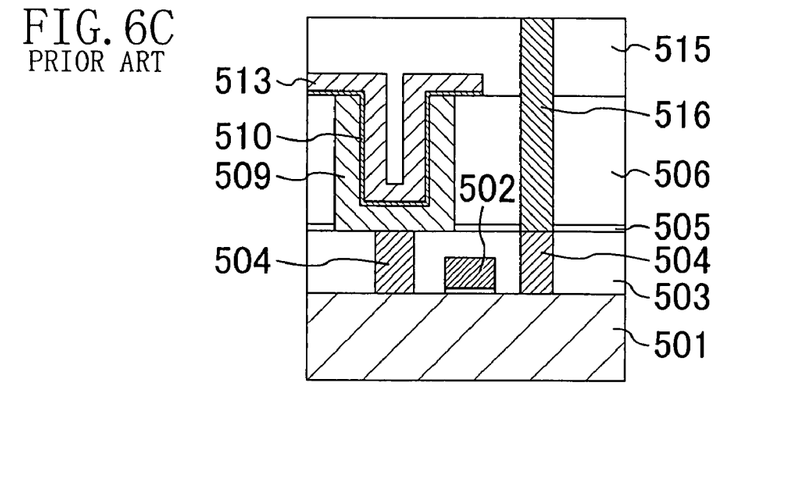

As shown in FIG. 6B, the silicon oxide film 514 is planarized by polishing through a chemical mechanical polishing (CMP) method, thereby forming the third interlayer film 515. Thereafter, as shown in FIG. 6C, the second contact plug 516 penetrating the second interlayer film 506 and the third interlayer film 515 is formed on the first contact plug 504b.

In the conventional DRAM fabrication method described above, in forming the third interlayer film 515, the insulating film having a greater thickness than the upper electrode 513 is deposited. Thereby, a step resulting from the height difference between the upper electrode 513 and the second interlayer film 506 is made gentle, and then planarization is performed by the CMP method or the like.

SUMMARY OF THE INVENTION

In the conventional DRAM described above, however, in formation of the interlayer film on the capacitor, planarization of the interlayer film is not conducted easily. This may cause troubles in which, for example, a bit line contact cannot be formed or patterning of an interconnect layer cannot be performed in a later process.

In the case of employing the conventional DRAM fabrication method, the third interlayer film 515 needs to have a sufficient thickness for the purpose of reducing the parasitic capacitance between interconnect layers to be formed over the upper electrode 513 and the third interlayer film 515 after the CMP polishing. For example, if the thickness of the upper electrode 513 is set at 100 nm, a height difference of 100 nm is created between the regions of the top surface of the second interlayer film 506 within which the upper electrode is present and absent. In order to form a flat third interlayer film 515 on them, it is necessary to deposit the insulating film with a sufficient thickness and then perform adequate polishing of the film. However, if miniaturization of the semiconductor device advances, better flatness of the third interlayer film 515 should be ensured. For example, as shown in FIG. 4, the second contact plug 516 is formed beside the upper electrode 513. In this structure, if miniaturization of the semiconductor device advances and the opening for the plug has a diameter of, for example, 50 nm, the focus margin in patterning the opening by lithography cannot be secured. This may cause a failure of opening patterning.

Figure 7A:
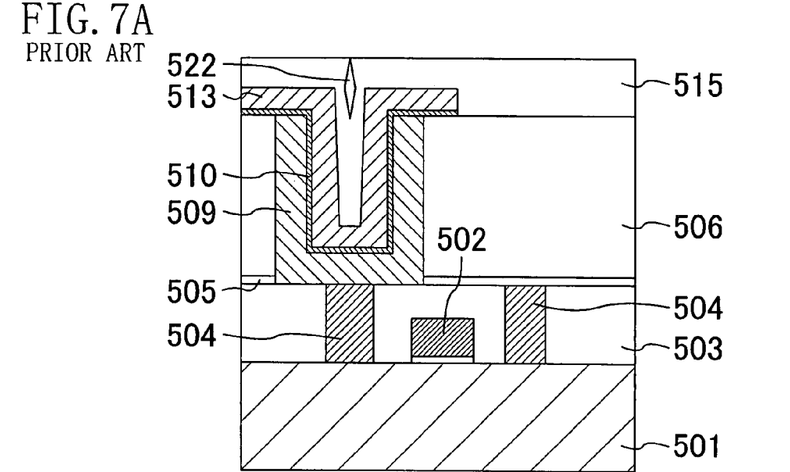
FIGS. 7A to 7C are sectional views showing some troubles occurring in an interlayer insulating film of the conventional DRAM.
Figure 7B:
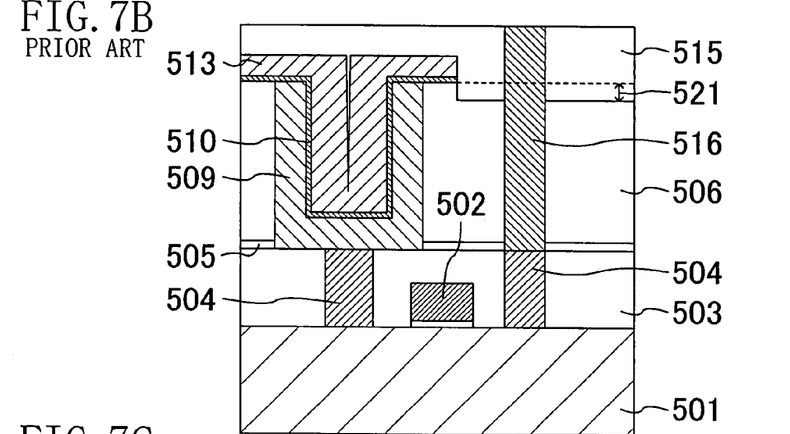
Figure 7C:
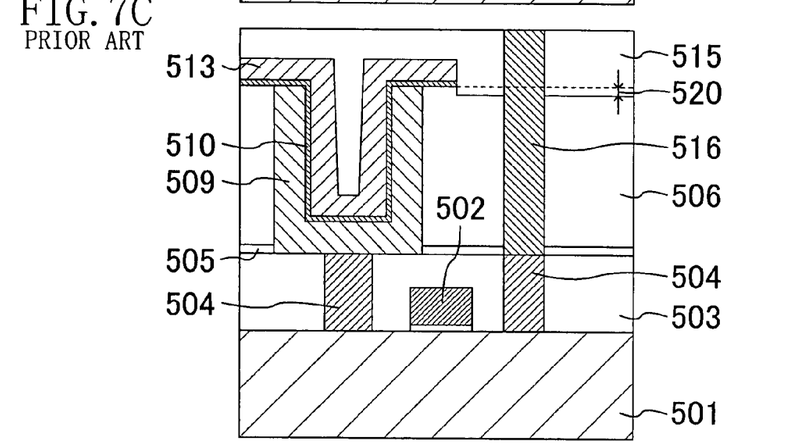

FIGS. 7A to 7C are views showing some troubles occurring in the interlayer insulating film of the conventional DRAM. In the case of fabricating the conventional trench-shaped stacked capacitor, as shown in FIG. 7A, a void 522 may be created inside the trench after deposition of the third interlayer film 515 on the upper electrode 513. In order to form the third interlayer film 515 provided in the trench to have a flat surface, it is necessary to carry out sufficient deposition and polishing of the insulating film. However, when miniaturization of the interconnect layers to be formed on the third interlayer film 515 advances, the problem in turn arises that patterning of the interconnect layers becomes difficult as in the case of the contact. In this situation, in order to reduce the clearance of the void 522, it is effective to thicken the upper electrode 513 as shown in FIG. 7B. In this case, however, the amount 521 of reduction of the interlayer film caused in etching the upper electrode 513 becomes greater than the amount 520 of reduction of the interlayer film caused in the case where the thickness of the upper electrode 513 is small (see FIG. 7C). Therefore, the height difference on the surface of the third interlayer film 515, which is created in depositing the film, becomes wider, so that planarization thereof requires much work. As described above, in the conventional DRAM, planarization of the interlayer film formed on the capacitor cannot be performed easily, which may make it difficult to form fine contacts or interconnect layers. Note that troubles similar to those described above can occur in FeRAMs (Ferroelectric Random Access Memories) having structures in which the capacitor of the DRAM is replaced with a ferroelectric capacitor.

In view of the problems described above, an object of the present invention is to provide a semiconductor device which can secure a good flatness of an insulating film formed on a capacitor even though the device is miniaturized, and to provide its fabrication method.

To attain the above object, a semiconductor device according to the present invention includes: a semiconductor substrate; a transistor which includes a first impurity diffusion layer and a second impurity diffusion layer formed in the semiconductor substrate, and a gate electrode formed above a region of the semiconductor substrate located between the first and second impurity diffusion layers as seen from a horizontal plane; a first interlayer insulating film formed on the semiconductor substrate and the gate electrode; a contact plug formed on the first impurity diffusion layer of the semiconductor substrate and penetrating the first interlayer insulating film; a second interlayer insulating film formed over the first interlayer insulating film and having an opening formed in a region thereof located above the contact plug; and a capacitor which includes a lower electrode formed on the contact plug, a capacitor insulating film formed on the inner and top surfaces of the lower electrode, and an upper electrode formed on the capacitor insulating film, the lower electrode being formed along the inner surface of the opening to have a concave cross section, the lower electrode being electrically connected to the first impurity diffusion layer, and the upper electrode includes: a first conductive film formed on the inner surface of the capacitor insulating film and filling the opening; and a second conductive film formed to extend from the top surface of the first conductive film to the top surface of the capacitor insulating film.

With this device structure, the first conductive film as part of the upper electrode fills up the opening. This makes it difficult to create a void at the center of the opening as compared with the conventional semiconductor device. Moreover, the second conductive film as part of the upper electrode is formed above the second interlayer insulating film to have a relatively small thickness, so that the height difference between the top surface of the second interlayer insulating film and the top surface of the upper electrode (the second conductive film) can be made smaller than that of the conventional semiconductor device. Thus, in the case where an additional insulating film or the like is provided on the upper electrode and the second interlayer insulating film, the interlayer insulating film with a good flatness can be provided relatively easily. Accordingly, with the semiconductor device according to the present invention, a semiconductor device can be provided which can have the interlayer insulating film with a good flatness provided on the capacitor and which can attain formation of fine contacts and interconnects.

Preferably, the second conductive film has a smaller thickness than the first conductive film. In this case, sufficient thickening of the first conductive film can ensure a sufficient capacitance of the capacitor even though the semiconductor device is miniaturized, and further thinning of the second conductive film can provide a smaller height difference between the top surface of the upper electrode and the top surface of the second interlayer insulating film. This further improves the effects described above.

Preferably, the second conductive film is made of a different material from the first conductive film. In this case, suitable materials can be selected according to the locations to be formed with the first and second conductive films, respectively. More preferably, the first conductive film is made of titanium nitride, and the second conductive film is made of tungsten nitride. When tungsten nitride is used as the material for the second conductive film, $WF_6$ having highly reductive property is fed as the raw material in forming tungsten nitride on the capacitor insulating film. Therefore, reduction of the capacitor insulating film can be prevented.

A method for fabricating a semiconductor device according to the present invention is a fabrication method of a semiconductor device which includes: a transistor having a first impurity diffusion layer, a second impurity diffusion layer, and a gate electrode; a capacitor having a lower electrode, a capacitor insulating film, and an upper electrode composed of a first conductive film and a second conductive film; a first interlayer insulating film; a second interlayer insulating film; and a contact plug. This method includes: the step (a) of forming the gate electrode above a semiconductor substrate, and forming, using the gate electrode as a mask, the first impurity diffusion layer and the second impurity diffusion layer in the semiconductor substrate; the step (b) of forming the first interlayer insulating film on the semiconductor substrate and the gate electrode; the step (c) of forming, on the first impurity diffusion layer, the contact plug penetrating the first interlayer insulating film; the step (d) of forming, over the first interlayer insulating film, the second interlayer insulating film provided with an opening reaching the top surface of the contact plug; the step (e) of forming, on the inner surface of the opening, the lower electrode electrically connected through the contact plug to the first impurity diffusion layer; the step (f) of forming the capacitor insulating film on the inner and top surfaces of the lower electrode; the step (g) of depositing the first conductive film on the capacitor insulating film at least until the opening is filled up therewith; the step (h) of removing the first conductive film until the top surface of the capacitor insulating film is exposed; and the step (i) of depositing the second conductive film on the top surface of the capacitor insulating film and the top surface of the first conductive film, thereby forming the upper electrode composed of the first and second conductive films.

With this method, in the step (g), the first conductive film as part of the upper electrode is allowed to fill the opening. Therefore, unlike the conventional semiconductor device, there is no necessity to form an interlayer insulating film at the center and its vicinity of the opening. Moreover, the diameter of the opening in filling it with the first conductive film can be made greater than the diameter of the opening in forming therein the silicon oxide film by the conventional method, so that the first conductive film can be allowed to fill the opening without creating any void. Therefore, the occurrence of a void can be prevented at the center and its vicinity of the opening. Furthermore, by forming, in the step (i), the second conductive film on the first conductive film and the capacitor insulating film, the height difference between the top surface of the upper electrode and the top surface of the second interlayer insulating film can be made smaller than that of the conventional semiconductor device. Thus, when an interlayer insulating film is provided on the capacitor in a subsequent process, the necessity to deposit the interlayer insulating film sufficiently thick is eliminated, so that the interlayer insulating film can be formed efficiently and planarized relatively easily. Therefore, with the method for fabricating a semiconductor device according to the present invention, the interlayer insulating film with a good flatness can be formed relatively easily on the capacitor even though the device is miniaturized, and also in subsequent processes, fine contacts and interconnect layers can be formed. Accordingly, the semiconductor device can be fabricated with good yields.

Preferably, the second conductive film formed in the step (i) has a smaller thickness than the first conductive film after completion of the step (h). In this case, sufficient thickening of the first conductive film can ensure a sufficient capacitance of the capacitor even though the semiconductor device is miniaturized, and further thinning of the second conductive film can provide a smaller height difference between the top surface of the upper electrode and the top surface of the second interlayer insulating film. This further improves the effects described above.

Preferably, the second conductive film is made of a different material from the first conductive film. In this case, suitable materials can be selected according to the locations to be formed with the first and second conductive films, respectively. More preferably, the first conductive film is made of titanium nitride, and the second conductive film is made of tungsten nitride. When tungsten nitride is used as the material for the second conductive film, $WF_6$ having highly reductive property is fed as the raw material in forming tungsten nitride on the capacitor insulating film. Therefore, reduction of the capacitor insulating film can be prevented.

DETAILED DESCRIPTION OF THE PREFERRED EMBODIMENTS

Embodiment

Figure 1:
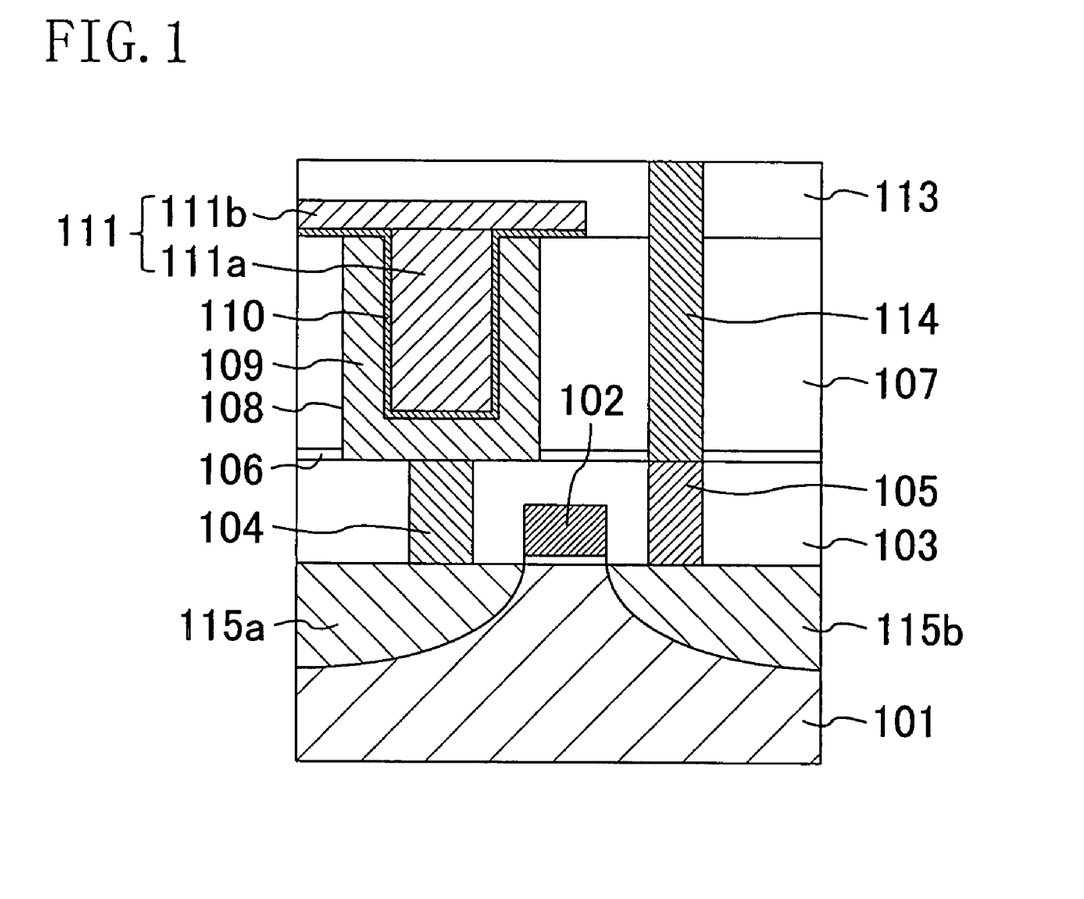
FIG. 1 is a sectional view of a semiconductor device according to an embodiment of the present invention.

Hereinafter, as a semiconductor device according to an embodiment of the present invention, a semiconductor device composed of a DRAM with a trench-shaped stacked capacitor will be described with reference to the accompanying drawings. FIG. 1 is a sectional view showing the structure of the semiconductor device according to this embodiment.

Referring to FIG. 1, the semiconductor device according to this embodiment includes: a semiconductor substrate 101; a first impurity diffusion layer 115a and a second impurity diffusion layer 115b; a gate electrode 102; a first interlayer insulating film 103; a first contact plug 104 and a second contact plug 105; and an etch stop film 106. The first and second impurity diffusion layers 115a and 115b are formed in the semiconductor substrate 101. The gate electrode 102 is formed above a region of the semiconductor substrate 101 located between the first and second impurity diffusion layers 115a and 115b as seen from a horizontal plane, and is formed with a gate insulating film interposed therebetween. The first interlayer insulating film 103 of, for example, a silicon oxide film is formed on the semiconductor substrate 101 and the gate electrode 102. The first and second contact plugs 104 and 105 are formed on the first and second impurity diffusion layers 115a and 115b, respectively, and penetrate the first interlayer insulating film 103. The etch stop film 106 of, for example, a silicon nitride film is formed on the first interlayer insulating film 103.

Furthermore, the semiconductor device according to this embodiment includes: a second interlayer insulating film 107; a lower electrode 109; a capacitor insulating film 110; and an upper electrode 111. The second interlayer insulating film 107 is formed on the etch stop film 106, and has an opening 108 provided in a region thereof located above the first contact plug 104. The lower electrode 109 of TiN (titanium nitride) or the like is formed above the first contact plug 104 to extend along the opening 108. The capacitor insulating film 110 of a HfO$_x$ film or the like is formed on the inner and top surfaces of the lower electrode 109 and a portion of the second interlayer insulating film 107. The upper electrode 111 of TiN or the like is provided on the capacitor insulating film 110. The capacitor composed of the lower electrode 109, the capacitor insulating film 110, and the upper electrode 111 is electrically connected through the first contact plug 104 to the first impurity diffusion layer 115a. The lower electrode 109 is formed to have a thickness of 10 to 30 nm, and the capacitor insulating film 110 is formed to have a thickness of about 10 nm.

In this structure, the upper electrode 111 is composed of: a first conductive film 111a formed on the inner surface of the capacitor insulating film 110 and filling the opening 108; and a second conductive film 111b formed to extend from the top surface of the first conductive film 111a to the top surface of the capacitor insulating film 110. The first conductive film 111a is made of, for example, titanium nitride having a thickness of 50 nm, and the second conductive film 111b is made of, for example, titanium nitride having a thickness of 20 nm.

Moreover, the semiconductor device according to this embodiment includes: a third interlayer insulating film 113; and a third contact plug 114. The third interlayer insulating film 113 is formed on the second interlayer insulating film 107, the side surface of the capacitor insulating film 110, and the second conductive film 111b. The third contact plug 114 is formed on the second contact plug 105, and penetrates the etch stop film 106, the second interlayer insulating film 107, and the third interlayer insulating film 113.

The semiconductor device according to this embodiment is characterized in that the first conductive film 111a as part of the upper electrode 111 fills up the opening 108. This structure makes it difficult to create a void at the center of the opening 108 as compared with the conventional semiconductor device. Moreover, the second conductive film 111b as part of the upper electrode 111 is formed above the second interlayer insulating film 107 to have a relatively small thickness, so that the height difference between the top surface of the second interlayer insulating film 107 and the top surface of the upper electrode 111 (the second conductive film 111b) becomes smaller than that of the conventional semiconductor device. Thus, the third interlayer insulating film 113 with a good flatness can be provided on the upper electrode 111 and the second interlayer insulating film 107. Accordingly, with the semiconductor device according to this embodiment, a semiconductor device can be provided which can have the interlayer insulating film with a good flatness provided on the capacitor and which can attain formation of fine contacts and interconnects. The reason why the second conductive film 111b can be formed to have a smaller thickness than the upper electrode of the conventional semiconductor device is that since the opening 108 is filled up with the first conductive film 111a, there is no necessity to take the occurrence of a void into consideration.

Next, a method for fabricating a semiconductor device according to this embodiment will be described with reference to the accompanying drawings. FIGS. 2A to 2H and 3A to 3F are sectional views showing the method for fabricating a semiconductor device according to this embodiment, respectively.

Figure 2A:
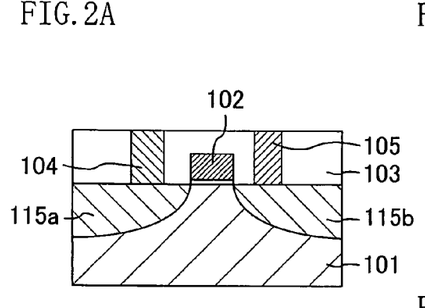
FIGS. 2A to 2H are sectional views showing a method for fabricating a semiconductor device according to this embodiment of the present invention.

First, in the step shown in FIG. 2A, the gate electrode 102 of the DRAM cell transistor is formed above the semiconductor substrate 101 made of silicon or the like, and then using the gate electrode 102 as a mask, the first and second impurity diffusion layers 115a and 115b are formed in the semiconductor substrate 101. Then, the first interlayer insulating film 103 is formed on the semiconductor substrate 101 and the gate electrode 102. Subsequently, the first contact plug 104 penetrating the first interlayer insulating film 103 is formed on the first impurity diffusion layer 115a, and the second contact plug 105 penetrating the first interlayer insulating film 103 is formed on the second impurity diffusion layer 115b.

Figure 2B:
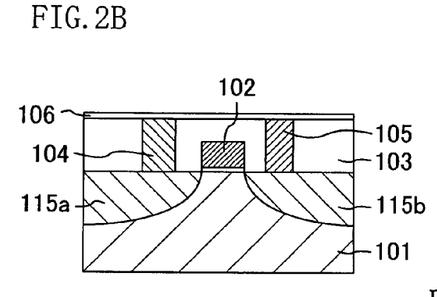
Figure 2C:
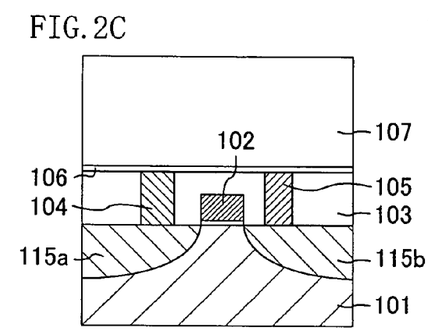

In the step shown in FIG. 2B, the etch stop film 106 of, for example, a silicon nitride film is deposited which has a thickness of 30 nm. Thereafter, in the step shown in FIG. 2C, the second interlayer insulating film 107 of, for example, a silicon oxide film having a thickness of 500 nm is formed on the etch stop film 106.

Figure 2D:
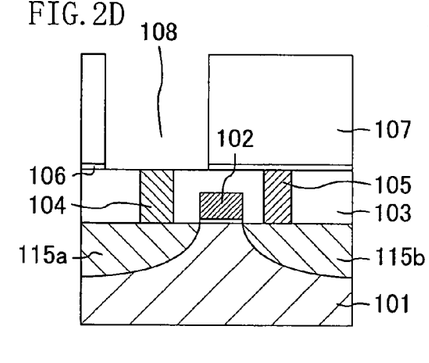

Next, in the step shown in FIG. 2D, portions of the second interlayer insulating film 107 and the etch stop film 106 are removed by a lithography method and a dry etching to expose the top surface of the first contact plug 104, thereby forming the opening 108 for forming the capacitor. The opening 108 is formed to have, for example, an opening diameter of 0.15 μm and a depth of 0.20 μm.

Figure 2E:
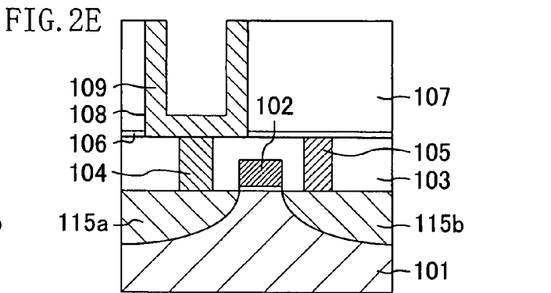
Figure 2F:
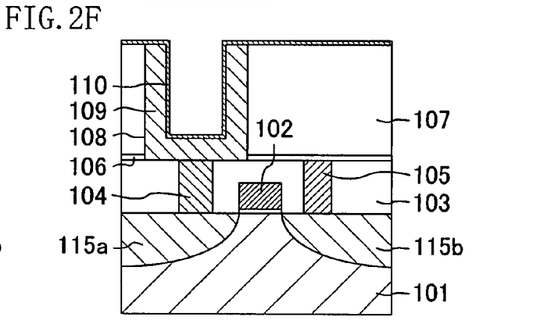

In the step shown in FIG. 2E, the lower electrode 109 of, for example, titanium nitride having a thickness of 20 nm is formed on the inner surface of the opening 108. Then, in the step shown in FIG. 2F, the capacitor insulating film 110 of, for example, a HfO$_x$ film having a thickness of 10 nm is deposited on the lower electrode 109 and the second interlayer insulating film 107.

Figure 2G:
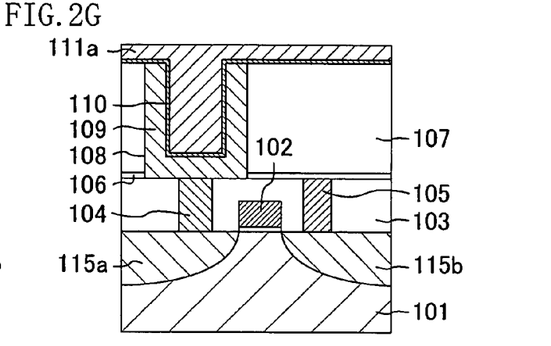

Subsequently, in the step shown in FIG. 2G, on the capacitor insulating film 110, the first conductive film 111a of, for example, a TiN film having a thickness of 80 nm is deposited to fill the opening 108.

Figure 2H:
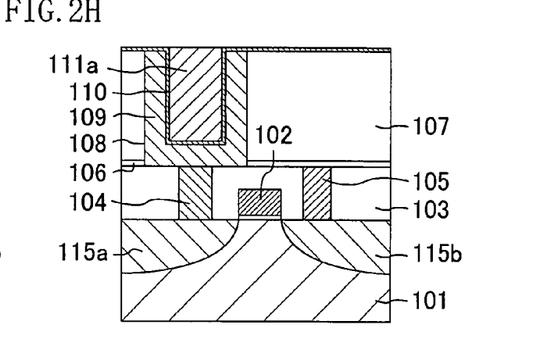

In the step shown in FIG. 2H, the first conductive film 111a deposited in the previous step (FIG. 2G) is removed by a CMP method until the top surface of the capacitor insulating film 110 is exposed. Thereby, the first conductive film 111a filling up the opening 108 is formed. In this step, the portion of the capacitor insulating film 110 formed on the second interlayer insulating film 107 may be removed together with the first conductive film 111a.

Figure 3A:
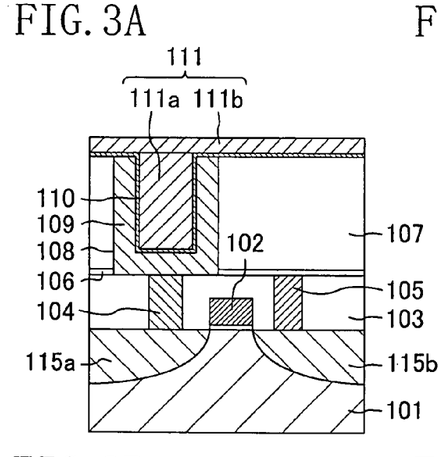
FIGS. 3A to 3F are sectional views showing the method for fabricating a semiconductor device according to this embodiment of the present invention.
Figure 3B:
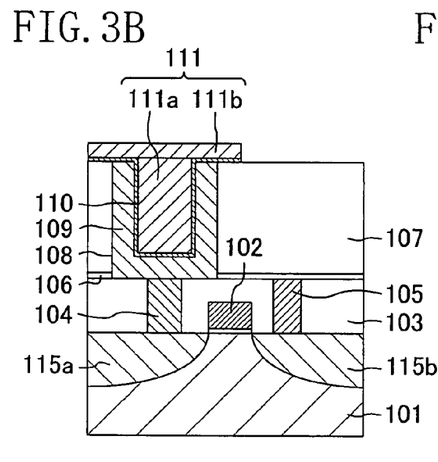

Next, in the step shown in FIG. 3A, the second conductive film 111b of, for example, a TiN film having a thickness of 20 nm is formed on the top surface of the capacitor insulating film 110 and the top surface of the first conductive film 111a. Thereafter, in the step shown in FIG. 3B, the portions of the capacitor insulating film 110 and the second conductive film 111b are removed by a lithography method and a dry etching to form the upper electrode 111 composed of the first and second conductive films 111a and 111b.

Figure 3C:
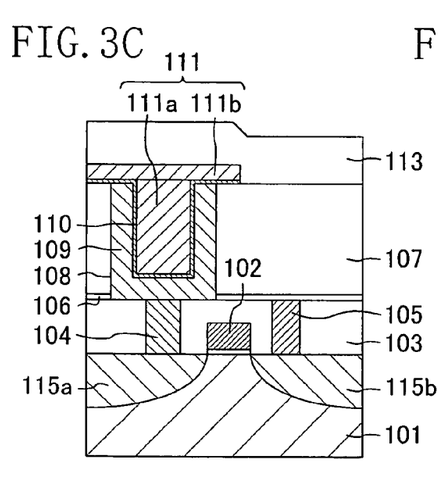
Figure 3D:
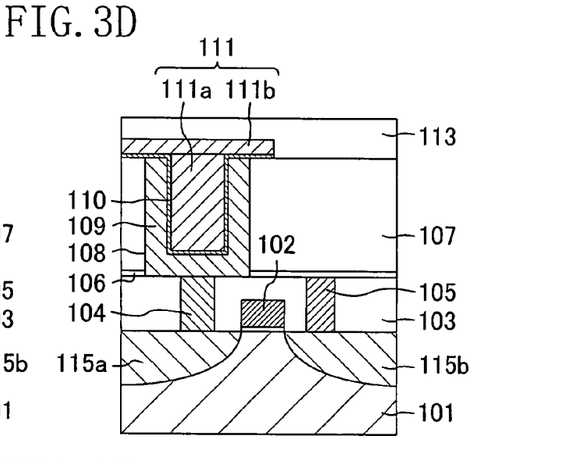

In the step shown in FIG. 3C, the third interlayer insulating film 113 of, for example, a silicon oxide film having a thickness of 220 nm is deposited on the second interlayer insulating film 107, the side surface of the capacitor insulating film 110, and the second conductive film 111b. Then, in the step shown in FIG. 3D, by a CMP method, the third interlayer insulating film 113 is planarized by polishing it by a thickness of, for example, 120 nm. After completion of this polishing, the thickness of the third interlayer insulating film 113 is 100 nm.

Figure 3E:
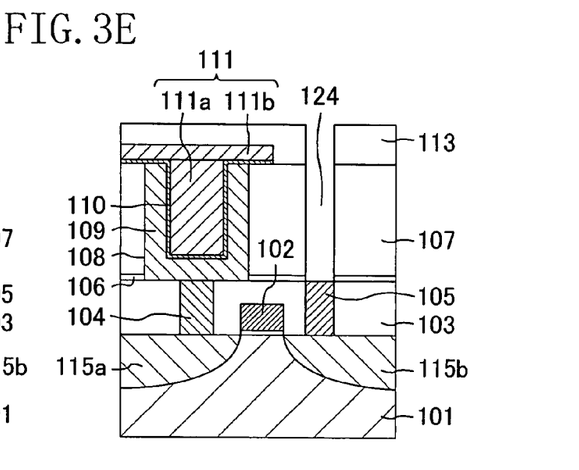

Subsequently, in the step shown in FIG. 3E, by a lithography and a dry etching, a contact hole 124 is formed which penetrates the etch stop film 106, the second interlayer insulating film 107, and the third interlayer insulating film 113 to reach the top surface of the second contact plug 105.

Figure 3F:
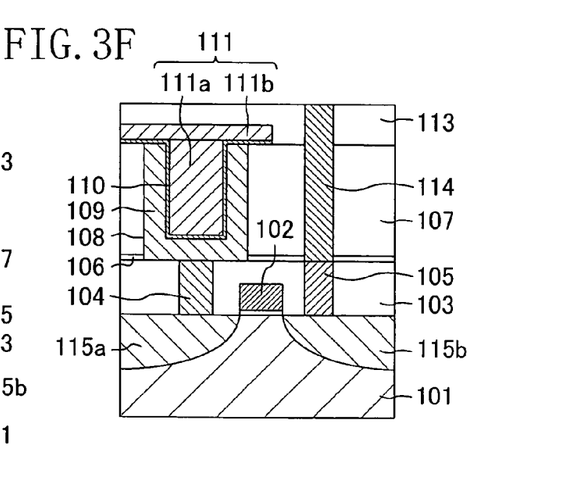

In the step shown in FIG. 3F, the contact hole 124 is filled with a conductive material such as TiN or W to form the third contact plug 114 making connection with the second contact plug 105. By performing predetermined processes subsequent to this step, the semiconductor device according to this embodiment can be fabricated.

The method for fabricating a semiconductor device according to this embodiment is characterized in that the opening 108 is filled up with the first conductive film 111a in the step shown in FIG. 2H and then the second conductive film 111b is provided, thereby forming the upper electrode 111 composed of the first and second conductive films 111a and 111b. With this method, the first conductive film 111a as part of the upper electrode 111 is allowed to fill the opening 108. Therefore, unlike the conventional semiconductor device, there is no necessity to form an interlayer insulating film at the center and its vicinity of the opening 108. Moreover, the diameter of the opening 108 in filling it with the first conductive film 111a can be made greater than the diameter of the opening 507 in forming therein the silicon oxide film 514 (see FIG. 6A) by the conventional method, so that the first conductive film 111a can be allowed to fill the opening without creating any void. Therefore, the occurrence of a void can be prevented at the center and its vicinity of the opening 108. Furthermore, by forming the second conductive film 111b on the first conductive film 111a and the capacitor insulating film 110, the height difference between the top surface of the upper electrode 111 and the top surface of the second interlayer insulating film 107 can be made smaller than that of the conventional semiconductor device. This eliminates the necessity to deposit the sufficiently-thick third interlayer insulating film on the capacitor. Therefore, the third interlayer insulating film 113 can be formed efficiently and planarized relatively easily. As a result, with the method for fabricating a semiconductor device according to this embodiment, the interlayer insulating film with a good flatness can be formed relatively easily on the capacitor even though the device is miniaturized, and also in subsequent processes, fine contacts and interconnect layers can be formed. Accordingly, the semiconductor device can be fabricated with good yields.

Preferably, in the semiconductor device and its fabrication method according to this embodiment, the second conductive film 111b has a smaller thickness than the first conductive film 111a. In this case, preferably, the first conductive film 111a has a thickness of 10 to 200 nm inclusive, and preferably, the second conductive film has a thickness of 5 to 30 nm inclusive. In the fabrication method of this embodiment, the thickness of the second interlayer insulating film 107, which serves as the height of the capacitor, is set at 0.2 μm. However, the film with a thickness ranging from 0.2 to 2 μm inclusive can also provide the same effects.

Preferably, in the semiconductor device and its fabrication method according to this embodiment, the upper electrode 111 and the lower electrode 109 are made of TiN. However, their materials are not limited to this. Even though the upper electrode 111 and the lower electrode 109 are made of a metal film of, for example, tungsten nitride (WN), ruthenium oxide (RuO), platinum (Pt), or titanium silicon nitride (TiSiN) and a stacked film of the above-listed materials, the effect described above can be provided.

Preferably, in the semiconductor device and its fabrication method according to this embodiment, the second conductive film 111b is made of a different material from the first conductive film 111a. Preferably, for example, the first conductive film 111a is made of titanium nitride and the second conductive film 111b is made of tungsten nitride. In this case, when tungsten nitride is used as the material for the second conductive film 111b, $WF_6$ having highly reductive property is fed as the raw material in forming tungsten nitride on the capacitor insulating film 110. Therefore, reduction of the capacitor insulating film 110 can be prevented.

Preferably, the material for the capacitor insulating film 110 is made of metal oxide. To be more specific, use may be made of, other than $HfO_x$ employed in this embodiment, a metal oxide film of, for example, tantalum oxide ($TaO_x$), zirconium oxide ($ZrO_x$), niobium oxide ($NbO_x$), and aluminum oxide ($AlO_x$), and a stacked film of the above-listed materials.

As described above, the semiconductor device and its fabrication method according to the present invention are useful for miniaturization of a semiconductor device with a stacked capacitor, such as a DRAM.

What is claimed is:

1. A semiconductor device comprising:
a semiconductor substrate;
a transistor which includes a first impurity diffusion layer and a second impurity diffusion layer formed in the semiconductor substrate, and a gate electrode formed above a region of the semiconductor substrate located between the first and second impurity diffusion layers as seen from a horizontal plane;
a first interlayer insulating film formed on the semiconductor substrate and the gate electrode;
a contact plug formed on the first impurity diffusion layer of the semiconductor substrate and penetrating the first interlayer insulating film;
a second interlayer insulating film formed over the first interlayer insulating film and having an opening formed in a region thereof located above the contact plug; and
a capacitor which includes a lower electrode formed on the contact plug, a capacitor insulating film formed on the inner and top surfaces of the lower electrode, and an upper electrode formed on the capacitor insulating film, the lower electrode being formed along the inner surface of the opening to have a concave cross section, the lower electrode being electrically connected to the first impurity diffusion layer,
wherein the upper electrode includes: a first conductive film formed on the inner surface of the capacitor insulating film and formed only in the opening; and a second conductive film formed to extend from the top surface of the first conductive film to the top surface of the capacitor insulating film, and
the top surface of the lower electrode is substantially flush with the top surface of the second interlayer insulating film.

2. The device of claim 1, wherein the second conductive film has a smaller thickness than the first conductive film.

3. The device of claim 1, wherein the second conductive film is made of a different material from the first conductive film.

4. The device of claim 3, wherein the first conductive film is made of titanium nitride, and the second conductive film is made of tungsten nitride.

5. The device of claim 1, wherein the second conductive film has a thickness of 5 to 30 nm inclusive.

6. The device of claim 1, wherein the first conductive film has a thickness of 10 to 200 nm inclusive.

7. The device of claim 1, wherein the lower electrode and the upper electrode are made of titanium nitride.

8. The device of claim 1, wherein the capacitor insulating film is made of metal oxide.

9. The device of claim 8, wherein the capacitor insulating film is made of hafnium oxide.

10. The device of claim 8, wherein the capacitor insulating film is made of tantalum oxide.

11. The device of claim 8, wherein the capacitor insulating film is made of zirconium oxide.

12. The device of claim 8, wherein the capacitor insulating film is made of niobium oxide.

13. The device of claim 8, wherein the capacitor insulating film is made of aluminum oxide.

14. The device of claim 8, wherein the capacitor insulating film is a stacked film made of at least any two of hafnium oxide, tantalum oxide, zirconium oxide, niobium oxide and aluminum oxide.

15. The device of claim 1, wherein the first conductive film fills up the opening.

16. The device of claim 1, wherein the lower electrode is made of tungsten nitride.

17. The device of claim 1, wherein the lower electrode is made of ruthenium oxide.

18. The device of claim 1, wherein the lower electrode is made of platinum.

19. The device of claim 1, wherein the lower electrode is made of titanium silicon nitride.

20. The device of claim 1, wherein the lower electrode is a stacked film made of at least any two of titanium nitride, tungsten nitride, ruthenium nitride, platinum and titanium silicon nitride.

\* \* \* \* \*